US006890825B2

(12) United States Patent
Ross et al.

(10) Patent No.: US 6,890,825 B2
(45) Date of Patent: *May 10, 2005

(54) METHOD FOR CONTROLLING DOPANT PROFILES AND DOPANT ACTIVATION BY ELECTRON BEAM PROCESSING

(75) Inventors: Matthew F. Ross, La Jolla, CA (US); Charles Hannes, Escondido, CA (US); William R. Livesay, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 10/211,854

(22) Filed: Aug. 2, 2002

(65) Prior Publication Data

US 2003/0008481 A1 Jan. 9, 2003

Related U.S. Application Data

(62) Division of application No. 09/590,066, filed on Jun. 8, 2000, now Pat. No. 6,489,225.
(60) Provisional application No. 60/138,740, filed on Jun. 11, 1999.

(51) Int. Cl.$^7$ ............................................ H01L 21/336
(52) U.S. Cl. ..................................... 438/308; 438/563

(58) Field of Search ................................ 438/300–308, 438/542–564; 257/57–61, 66–72, 133–145, 200–211, 252–413

(56) References Cited

U.S. PATENT DOCUMENTS

| | | | |
|---|---|---|---|
| 3,950,187 A | 4/1976 | Kirkpatrick | 148/1.5 |
| 4,415,372 A | 11/1983 | Koshino et al. | 148/1.5 |
| 5,306,662 A | 4/1994 | Nakamura et al. | 437/107 |
| 5,750,443 A | 5/1998 | Sakamoto | 549/795 |
| 6,489,225 B1 * | 12/2002 | Ross et al. | 428/535 |

OTHER PUBLICATIONS

A.C. Greenwald, et al. "Pulsed–Electron–Beam Annealing of Ion–Implantation Damage", Spire Corporation, Bedford, Massachusetts 01730 (Accepted for Publication Aug. 22, 1978), J. Appl. Phys. 50(2), Feb. 1979, 1979 American Institute of Physics, pp. 783–787.

* cited by examiner

*Primary Examiner*—H. Jey Tsai
(74) *Attorney, Agent, or Firm*—Roberts & Roberts

(57) ABSTRACT

An improved dopant application system and method for the manufacture of microelectronic devices accurately places dopant on and within a dielectric or semiconductor surface. Diffusing and activating p-type and n-type dopants in dielectric or semiconductor substrates is achieved by means of electron beam irradiation.

19 Claims, 3 Drawing Sheets

METHOD FOR CONTROLLING DOPANT PROFILES AND DOPANT ACTIVATION BY ELECTRON BEAM PROCESSING

CROSS REFERENCE TO RELATED APPLICATION

This application claims the benefit of provisional application Ser. No. 60/138,740 filed Jun. 11, 1999, and is a divisional of U.S. patent application Ser. No. 09/590,066 filed Jun. 8, 2000, now U.S. patent application Ser. No. 6,489,225 which are incorporated herein by reference.

BACKGROUND OF THE INVENTION

1. Field of the Invention

The present invention relates to the manufacture of microelectronic devices. An improved method places dopant on and within a dielectric or semiconductor surface. More particularly, the invention pertains to a process of diffusing and activating p-type and n-type dopants in dielectric or semiconductor substrates by means of electron beam irradiation.

2. Description of the Prior Art

This invention relates to electron beam system and method and more particularly to a system and method for optimizing the placement of dopant material on a dielectric or semiconductor surface area. Ion implantation is a semiconductor doping process whereby a plurality of dopant atoms are first ionized, and then accelerated to velocities sufficient to penetrate the semiconductor surface and deposited therein. It is well known to produce semiconductors whose electrical behavior can be altered by the introduction of minute quantities of elemental materials called "dopants." Dopants are either p-type or n-type. P-type dopants produce what is commonly known as hole conductivity while n-type dopants produce what is commonly known as electron conductivity. Combinations of hole and electron-rich regions produce the desired devices such as transistors, resistors, diodes, capacitors, etc., which form the basis of microelectronic device operation. Recent advances in semiconductor manufacture include fine-line geometries of dopant materials placed on a substrate to form very large scale integrated devices. Integrated circuits are generally formed by connecting the numerous individual devices made by dopant implantation. A single wafer may contain several thousand devices which are individually packaged as a single monolithic circuit. It is important that the doping process be accurately done in order to ensure the circuit operates according to design parameters. If doping does not bring about such operation, then the corresponding yields may be drastically reduced thereby adding to the cost of manufacture. Important factors relating to accurate doping are the need to control the number of doping ions introduced in the surface material, the need to control the uniformity of doping ions placed across the surface, the need to control the depth or concentration profile of dopant placed into the surface, and the need to ensure the doping pattern can be introduced as a maskable pattern on the surface. Each of these factors must be closely monitored and can be achieved by several different techniques.

In the fabrication of complimentary metal-oxide-semiconductor (CMOS) circuits, dopants can be introduced by several different methods, including ion implant processing, spin-on dopant diffusion and bulk diffusion of dopant into non-masked surface regions. Another technique may involve direct sourcing of an ion beam at select fine-line areas into non-masked regions. The latter technique generally involves ion beam implantation system. Ion implant processing has become the method of choice for advanced devices. Once the dopant is introduced into the semiconductor substrate it must be distributed properly and activated to provide the proper/desired electrical properties in the semiconductor. The conventional method of achieving the diffusion and activation of dopants is thermal processing. This has been done by furnace processing or rapid thermal annealing. The furnace process is usually a long process of heating at a high temperature, for example 30 minutes to 6 hours at 600° C. to 1700° C. There are several problems with thermal processing to achieve diffusion and activation of dopants. The random thermal motion of the dopant atoms in the semiconductor lattice does not necessarily achieve the desired distribution of the dopant atoms in the device. Thermal activation of the dopant is a random process and therefore it is difficult to accurately control the activation of the dopant to achieve the desired electrical properties. The high temperatures involved in diffusion and activation of dopants can be detrimental to the overall performance of the device as each time the substrate is heated, all dopants in the substrate can continue to diffuse. Thus, it would be desirable to use low temperatures and short processing times.

According to this invention an electron beam is applied to the substrate, in conjunction with heating the substrate, to achieve the diffusion and activation of the dopant in the substrate. This addresses the problems involved in thermal processing. By using an electron flux at a given energy the depth of the electrons can be controlled very accurately. Thus the dopant atom motion can be limited to the region where the electrons interact with the substrate, and not necessarily the random thermal motion throughout the entire substrate as in thermal processing. By using an electron flux at a given energy and dose, the activation of the dopant can be very precisely controlled to achieve the desired electrical properties in the substrate. By relying on the kinetic energy to carry out the diffusion and activation of the dopants the peak temperature of the process can be reduced, thus improving uniformity.

SUMMARY OF THE INVENTION

The invention provides a process for producing a microelectronic device which comprises introducing a dopant into a dielectric or semiconductor substrate; and then subjecting the substrate to sufficient electron beam irradiation to distribute and activate the dopant in the substrate.

The invention also provides a microelectronic device which comprises a dielectric or semiconductor substrate, and a dopant in the substrate which dopant has been distributed and activated in the substrate by electron beam irradiation.

The invention also provides a process for producing a microelectronic device which comprises
(a) introducing a dopant into a dielectric or semiconductor substrate by spin coating the substrate with a dopant containing composition;
(b) drying the composition on the substrate;
(c) subjecting the substrate to sufficient electron beam irradiation to distribute and activate the dopant in the substrate; and
(d) removing any excess dopant containing composition.

DETAILED DESCRIPTION OF THE PREFERRED EMBODIMENT

Figure 1A:
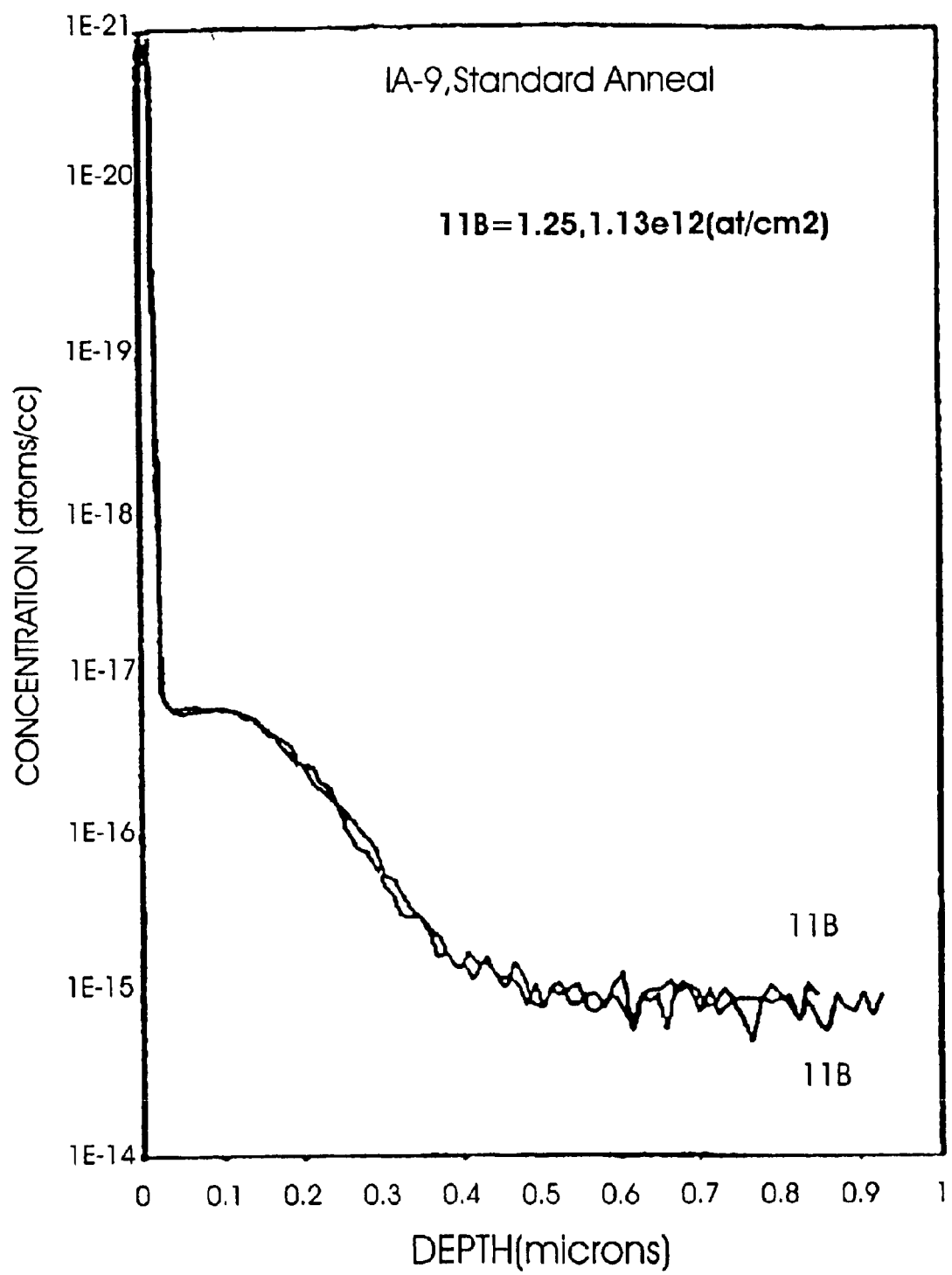
FIG. 1(A), FIG. 1(B), and FIG. 1(C) show secondary ion mass spectroscopy (SIMS) dopant distribution analysis for wafers produced according to Example 8.

The first step in the process for producing a microelectronic device comprises introducing a p-type dopant and/or an n-type dopant into a dielectric or semiconductor substrate.

Suitable substrate nonexclusively include gallium arsenide, germanium, silicon, silicon germanium, lithium niobate, crystalline silicon, polysilicon, amorphous silicon, epitaxial silicon, silicon dioxide and combinations thereof. Suitable n-type dopants nonexclusively include phosphorous, arsenic, antimony and combinations thereof. Suitable p-type dopants nonexclusively include boron, aluminum, gallium, thallium, indium, silicon and combinations thereof.

There are several ways to apply the dopant to the substrate. These include ion implant processing, spin-on dopant processing and plasma dopant processing. Such techniques are well known in the art. Dopants may be applied to a substrate in gaseous form in an ion implanter or may be applied to a substrate as a spin-on liquid dopant with subsequent drying. Such are available from AlliedSignal of Sunnyvale Calif. The nature of the invention is not limited to the way the dopant is applied to the substrate. As a first step, a dopant is applied to a substrate. Depending on the method of application the dopant will have a particular starting profile. For example, in ion implant processing, the ions are implanted into the substrate at a desired energy and dose. The initial profile will depend on the energy of the ions and the dose applied. An ion beam implantation system generally uses an ion source which functions to supply an "ionized atom" of dopant material. An ion source removes one or more electrons from the dopant atom thereby creating a positively charged ionized atom which can be extracted and accelerated to a target surface such as a semiconductor surface. Elements of an ion source include a relatively high pressure area contained within a chamber configured to a receive gaseous compound of selected dopant material. Depending upon the type of dopant used, either p-type of n-type, dopant can be introduced as a gas into the chamber. The dopant-rich gas containing atoms of the desired species generally receives electrons generated from an ionizing filament. The filament radiates electrons when it is heated to a specific temperature and when a specific extraction voltage is applied thereto. Collision between electrons and gas atoms results in the desired ionization within chamber. The ions are then extracted by use of an electrostatic field created by charged extraction electrodes placed along ion path. Acceleration may be needed in order to ensure penetration of ions into the substrate surface. The amount of acceleration is directly proportional to a beam current. As beam current increases, the amount of dopant ions placed within the desired area of the substrate gate may also be proportionally increased. The ion source includes an ionizing filament and a chamber capable of receiving the ionizing filament. The filament can be heated thereby causing the generation of a plurality of ions through which they can be extracted through the gas chamber. The chamber can be evacuated and filled with a gaseous compound such as phosphorous, arsenic, boron, or any other type of semiconductor dopant material common in the art. The ion implantation system also includes a plurality of acceleration electrodes. An ion beam is configured for emission from aperture having a varying beam current. If the beam current is increased, ionization time can be correspondingly decreased to achieve the same dopant level upon the same surface area. As such, it is advantageous that a maximum beam current be used to increase the throughput of ion implantation. Faster implantation will allow more wafers to be doped using a single ion implantation system. Thus, faster implantation need not require purchase of additional systems to achieve the same throughput. One useful implanter is an Applied Materials, Inc. model no. AMT-9200 implanter. The dopant can also be introduced by sputter deposition and spin deposition.

Once formed, the dopant applied substrate is exposed to electron beam irradiation under conditions sufficient to distribute and activate the dopant in the substrate. Electron beam radiation may take place in any chamber having a means for providing electron beam radiation to substrates placed therein. The substrate is then exposed with the electron beam at an energy and dose, while the substrate is heated to the appropriate temperature, to achieve the desired dopant profile in the substrate. It is preferably loaded into a vacuum chamber with a flood electron source to expose the top side of the substrate and a heating element, for example quartz infra-red lamps, to apply heat to the back-side of the substrate. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation of San Diego, Calif. under the trade name "ElectronCure™". The preferred process chamber is an ElectronCure™ 1200-ID system. The principles of operation and performance characteristics of such device are described in U.S. Pat. No. 5,003,178, the disclosure of which is incorporated herein by reference. The temperature of the electron beam exposure preferably ranges from about 20° C. to about 650° C., more preferably from about 250° C. to about 450° C. The electron beam energy is preferably from about 0.5 KeV to about 30 KeV, and more preferably from about 3 to about 10 KeV. The dose of electrons is preferably from about 1 to about 500,000 $\mu C/cm^2$ and more preferably from about 50 to about 20,000 $\mu C/cm^2$. Generally, it is preferred that the exposing step is carried out at a pressure of from about $10^{-5}$ Torr to about $10^2$ Torr. The electron beam irradiation is conducted in a gas selected from the group consisting of nitrogen, oxygen, hydrogen, argon, xenon, helium, ammonia, silane, a blend of hydrogen and nitrogen, ammonia and mixtures thereof. Electron beam exposure may be controlled by setting the beam acceleration. The electron beam radiation is controlled such that the electrons range is concentrated at a plane between the upper and lower surfaces of the layer. The gas ambient in the electron beam tool can be any of the following gases: nitrogen, oxygen, hydrogen, argon, a blend of hydrogen and nitrogen, ammonia, xenon, forming gas or any combination of these gases. The electron beam current is preferably from about 1 to about 150 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches. Preferably the electron beam irradiation is conducted with a uniform, large-area, overall electron beam exposure source which simultaneously exposes substantially all of the substrate simultaneously. The energy selected depends on the desired profile for the dopant in the substrate. The dose applied is determined by analysis of the profiles after electron beam processing. A dose that achieves the desired profile for a given application is used. The temperature is selected according to the needs for diffusion and activation, which will be dopant species dependent. The electron beam processing accomplishes the diffusion of the dopants and the electrical activation of the dopants in the substrate. According to the application of the dopant in the substrate, the appropriate electron beam process parameters are used to generate the desired dopant profile. The advantage of the electron beam process is that the diffusion can be accomplished at temperatures below where solid-state diffusion occurs. The dopant motion is accomplished by the kinetic energy of the electrons in the substrate lattice. This mechanism may allow for a more directional diffusion of dopants than is possible with the random thermal motion involved in conventional thermal dopant diffusion and activation. This implies that more precise control of dopant profiles is possible and that the temperature necessary for dopant diffusion can be much lower than for conventional thermal processes. In the event that the lattice damage induced by the ion implant is too severe for the electron beam process to re-crystallize the lattice, the electron beam process can be used in conjunction with a standard thermal process. In this case the effect of the electron beam is more for the activation of the dopant. The diffusion of the dopant and re-crystallization of the lattice are accomplished by the thermal process.

In one preferred embodiment of the invention, the doped substrate is first subjected to a thermal annealing step prior to electron beam treatment. This thermal annealing may be conducted at a temperature of from about 400° C. to about 1200° C., preferably from about 400° C. to about 1000° C. for from about 1 minute to about 60 minutes. It has been u expectedly found that a thermal annealing followed by electron beam exposure results in a shallower diffusion of dopant, i.e. dopant which is closer to the surface of the substrate. This results in a shallower device channel having a lower capacitance.

The following non-limiting examples serve to illustrate the invention.

EXAMPLE 1

Ion Implant dopant "drive-in". The term "drive-in" refers to the thermal process of diffusion and activation of the dopant applied to a substrate.

A substrate is implanted with ions at a given energy to a given dose. The substrate is exposed with the electron beam at a given energy to a given does with a given temperature applied to the substrate.

EXAMPLE 2

Spin-On Dopant "Drive-In"

A spin-on dopant is applied to the substrate and post apply baked. The spin-on dopant and substrate are then exposed with the electron beam at a specified energy and dose and temperature. The spin-on dopant film is removed from the substrate leaving the dopant profile in the substrate. The dopant profile is determined by the electron range.

EXAMPLE 3

PMOSFET Channel Doping

In the fabrication of CMOS circuits both NMOS and PMOS FETs are manufactured on the same substrate. To operate properly the threshold voltage $V_t$ of the NMOS and PMOS transistors must be properly controlled. To achieve this matching of NMOs and PMOS transistors an adjusting dopant is applied to the channel of each type of transistor. The dopant is preferably Boron. To achieve optimal performance of PMOS transistors the dopant needs to be as close to the surface of the channel as possible. If ion implant processing has been used to apply the dopant then a process must be applied to the dopant to get the proper dopant profile in. The challenge with ion implant doping is that the majority of the dopant is projected into the substrate so that the channel surface does not have the desired conduction properties.

Dopant is applied by ion implantation in the channel region. The substrate is then exposed with the electron beam at an energy that allows for dopant diffusion toward the surface of the channel. The electron beam exposure also activates the electrical properties of the dopant at the channel surface providing the desired conduction properties in the channel. The electron beam exposure may be carried out with a resist mask so that only the channel region of the PMOS devices is exposed to the beam and the remainder of the substrate is protected by the resist.

EXAMPLE 4

Self aligned dopant activation with a resist mask.

A photoresist mask is coated and exposed and developed to create the desired ion implant mask pattern. An ion implant process is carried out to the desired dose at the specified energy. After the ion implant process the substrate is exposed with the electron beam with the same resist mask. The resist mask is removed leaving the implanted and activated region.

EXAMPLE 5

Poly-Silicon Contact Dopant Activation

Poly-silicon is deposited on a substrate to the gate contact and local interconnect. The poly-silicon is then doped to achieve the desired conduction properties using ion implant processing. The doped poly-silicon is then exposed with the electron beam to activate the dopant. Photoresist is patterned on the poly-silicon and the pattern is transferred by etching the poly-silicon and the resist is removed.

EXAMPLE 6

Ion Implant

A series of test grade 6" silicon wafers are ion implanted with Boron (B) at either 25 KeV or 50 KeV and at 1E12 Dose under the conditions in Table 1. Those wafers which are annealed are thermally annealed at 1000° C. for 30 seconds. The wafers are processed with the Electron Cure system at 400° C. in Argon. These wafers, in addition to a untreated control wafers, are subjected to secondary Ion Mass Spectroscopy (SIMS) analysis. SIMS analysis gives the concentration of Boron as a function of depth from the wafer surface. The changes in this concentration determined by the SIMS analysis indicate the change in the dopant (B) concentration as a function of depth provided by the electron beam process and is compared with the thermal anneal process.

TABLE 1

| No. | Dose ($\mu C/cm^2$) | Voltage (keV) | Current (mA) | |
|---|---|---|---|---|
| 1 | 1000 | 7 | 10 | |
| 2 | 5000 | 7 | 20 | |
| 3 | 10000 | 7 | 20 | |
| 4 | 5000 | 12 | 20 | |
| 5 | 5000 | 7 | 20 | Thermal Anneal |
| 6 | | | | Thermal Anneal |
| 7 | | | | Thermal Anneal |
| 8 | 1000 | 10 | 10 | |
| 9 | 5000 | 10 | 20 | |
| 10 | 10000 | 10 | 20 | |
| 11 | 5000 | 15 | 20 | |

TABLE 1-continued

| No. | Dose (μC/cm²) | Voltage (keV) | Current (mA) | |
|---|---|---|---|---|
| 12 | 5000 | 15 | 20 | Thermal Anneal |
| 13 | | | | Thermal Anneal |
| 14 | | | | Thermal Anneal |
| 15 | 5000 | 7 | 20 | No Processing |
| 16 | 5000 | 12 | 20 | No Processing |
| 17 | | | | No Processing |
| 18 | | | | No Processing |
| 19 | | | | No Processing |

EXAMPLE 7

Ion Implant

6' silicon wafers are ion implanted under the following conditions: boron at 80 KeV and 5E14 Dose; Phosphorous at 80 KeV and 5E14 Dose. The wafers are measured for resistivity using a four point probe. A set of the wafers are thermally annealed. A set of the wafers are processed with different electron beam conditions with the Electron Cure system. The wafers are measured after processing using a four point probe. The change in resistivity indicates the change in dopant concentration and activation provided by the electron beam process as compared with the thermal process. The wafers are analyzed using SIMS analysis to determine the change in dopant concentration as a function of depth into the wafer provided by the electron beam process and compared to the thermal process.

EXAMPLE 8

Three series of test grade 6" silicon wafers are ion implanted with Boron (B) at 25 keV and at a dose of $1 \times 10^{12}$ atoms/cm² (1E12 Dose). One series of wafers are thermally annealed at 1000° C. for 10 seconds. A second series of wafers are thermally annealed at 1000° C. for 10 seconds and then exposed to electron beam irradiation at 3 keV and 5000 μC/cm² with an Electron Cure system at 400° C. in argon. A third series of wafers are thermally annealed at 1000° C. for 10 seconds and then exposed to electron beam irradiation at 7 keV and 5000 μC/cm² with an Electron Cure system at 400° C. in argon.

Figure 1B:
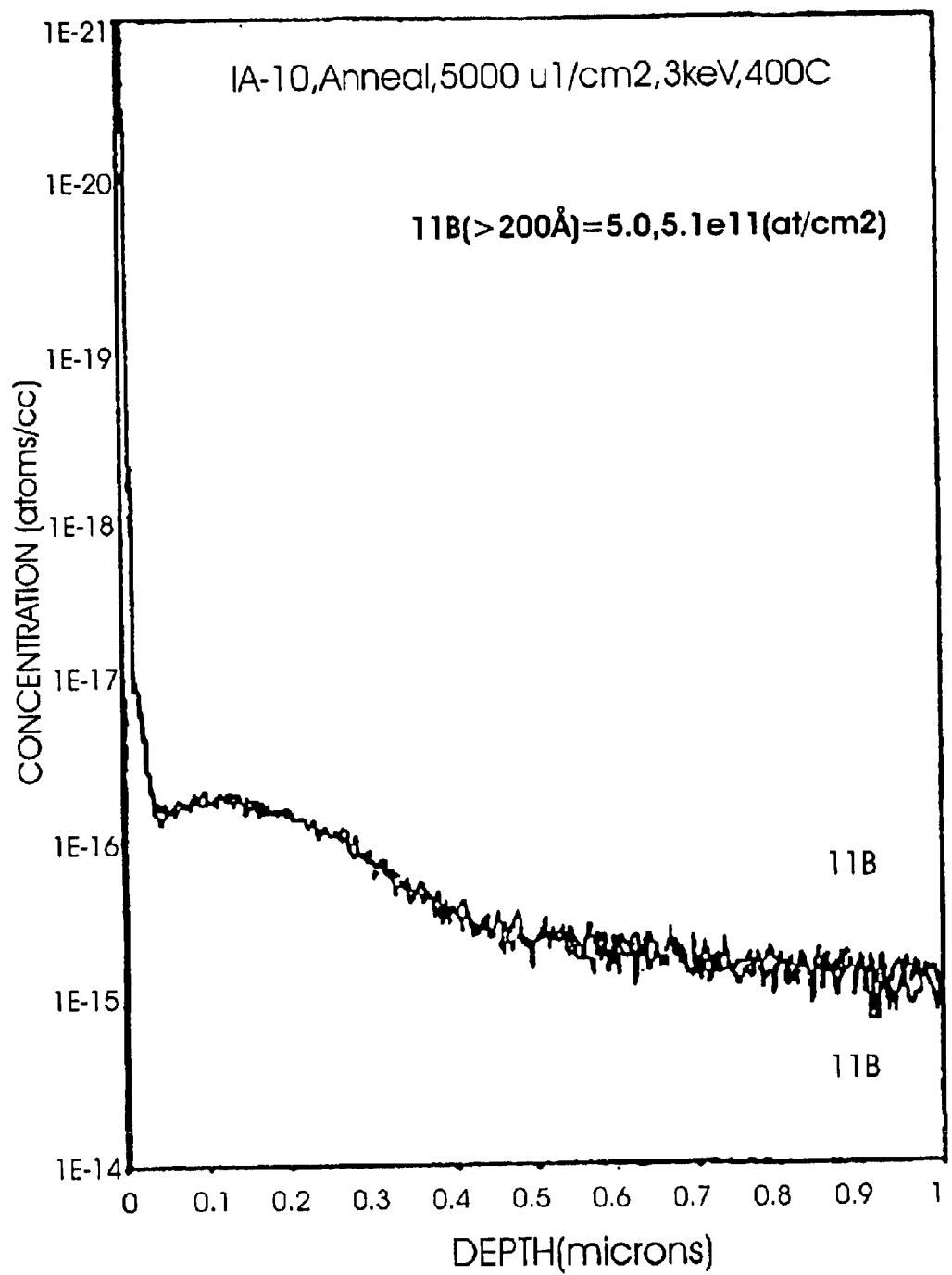
Figure 1C:
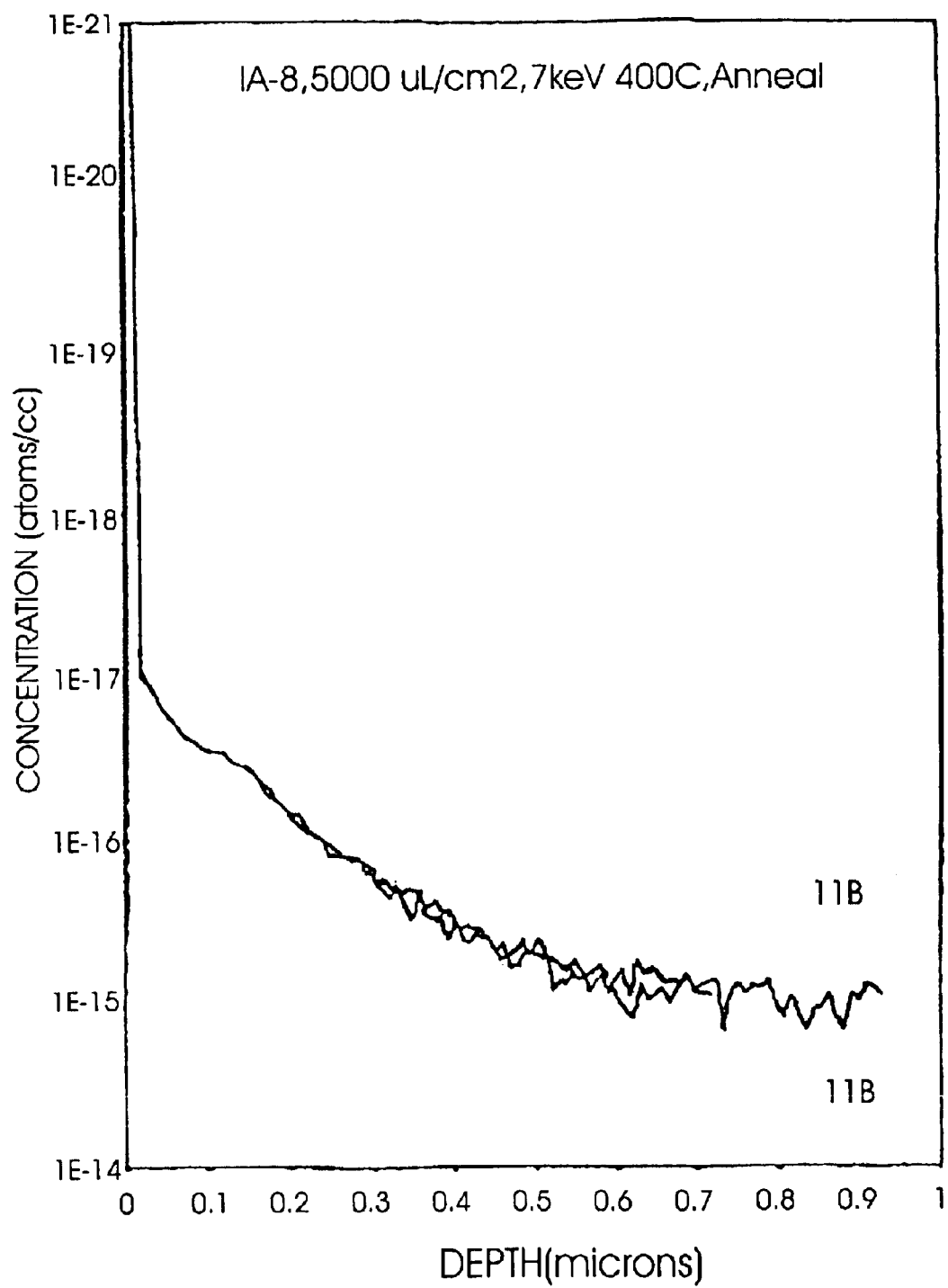

These wafers are subjected to secondary Ion Mass Spectroscopy (SIMS) analysis. SIMS analysis gives the concentration of Boron as a function of depth from the wafer surface. The changes in this concentration determined by the SIMS analysis indicate the change in the dopant (B) concentration as a function of depth provided by the thermal anneal plus electron beam processes as compared with the thermal anneal process alone. FIG. 1 compares SIMS profiles for the wafers. FIG. 1(a) shows the profile for wafers that received the ion implant process followed by thermal annealing alone. FIG. 1(b) shows the profile for wafers that received the ion implant process followed by thermal annealing and then exposure to electron beam irradiation at 3 keV and 5000 μC/cm² at 400° C. in argon. FIG. 1(c) shows the profile for wafers that received the ion implant process followed by thermal annealing and then exposure to electron beam irradiation at 7 keV and 5000 μC/cm² at 400° C. in argon. In FIG. 1(b) it can be seen that there is a spike in the profile at the surface of the silicon and that the profile going into the silicon is much reduced compared to the thermal annealing alone in FIG. 1(a). In FIG. 1(b) there is still some signature of the Gaussian shape of the ion implant profile. In FIG. 1(c) the shape of the profile has changed and the concentration appears to change almost linearly with depth into silicon. The concentration at the surface is still close to the starting concentration as seen in FIG. 1(a).

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for producing a microelectronic device which comprises
    (a) introducing a dopant into a dielectric or semiconductor substrate by spin coating the substrate with a dopant containing composition;
    (b) drying the composition on the substrate;
    (c) subjecting the substrate to sufficient electron beam irradiation to distribute and activate the dopant in the substrate, wherein the electron beam irradiation is conducted at an electron beam energy level ranging from about 0.5 to about 15 KeV and an electron beam current of from about 1 to about 150 mA, and wherein the electron beam irradiation is from a source which generates an electron dose ranging from about 1 to about 500,000 μC/cm²; and
    (d) removing any excess dopant containing composition.

2. The process of claim 1 wherein the dopant is a p-type dopant and/or an n-type dopant.

3. The process of claim 1 wherein after introducing the dopant into the substrate, but before electron beam irradiation, the doped substrate is subjected to a thermal annealing step.

4. The process of claim 1 wherein after introducing the dopant into the substrate, but before electron beam irradiation, the doped substrate is subjected to a thermal annealing step at a temperature of from about 400° C. to about 1200° C. for from about 1 minute to about 60 minutes.

5. The process of claim 1 wherein the doped substrate has been thermally annealed prior to electron beam irradiation.

6. The process of claim 1 wherein after step (a) but before step (c) the doped substrate is subjected to a thermal annealing step.

7. The process of claim 1 wherein after step (a) but before step (c) the doped substrate is subjected to a thermal annealing step at a temperature of from about 400° C. to about 1200° C. for from about 1 minute to about 60 minutes.

8. The process of claim 2 wherein the p-type dopant and/or n-type dopant is introduced into the substrate by ion implantation.

9. The process of claim 2 wherein p-type dopant is introduced into the substrate.

10. The process of claim 2 wherein n-type dopant is introduced into the substrate.

11. The process of claim 2 wherein both p-type dopant and n-type dopants are introduced into the substrate.

12. The process of claim 2 wherein the n-type dopant is selected from the group consisting of phosphorous, arsenic, antimony and combinations thereof.

13. The process of claim 2 wherein the p-type dopant is selected from the group consisting of boron, aluminum, gallium, thallium, indium, silicon and combinations thereof.

14. The process of claim 1 wherein the substrate comprises a material selected from the group consisting of gallium arsenide, germanium, silicon, silicon germanium, lithium niobate, crystalline silicon, polysilicon, amorphous silicon, epitaxial silicon, silicon dioxide and combinations thereof.

15. The process of claim 1 wherein the electron beam irradiation is conducted with a uniform, large-area, overall electron beam exposure source which simultaneously exposes substantially all of the substrate simultaneously.

16. The process of claim 1 wherein the electron beam irradiation is conducted with a uniform large-area electron beam source which covers an exposure area of from about 4 square inches to about 256 square inches simultaneously.

17. The process of claim 1 wherein the electron beam irradiation is conducted while heating the substrate to a temperature of from about 20° C. to about 650° C.

18. The process of claim 1 wherein the electron beam irradiation is conducted in a gas selected from the group consisting of nitrogen, oxygen, hydrogen, argon, xenon, helium, ammonia, silane, a blend of hydrogen and nitrogen, ammonia and mixtures thereof.

19. The process of claim 1 wherein the electron beam irradiation is conducted while the substrate is under a pressure maintained in the range of from about $10^{-5}$ to about $10^2$ torr.

* * * * *